(12) United States Patent
Kim

(10) Patent No.: US 6,779,253 B2
(45) Date of Patent: *Aug. 24, 2004

(54) GRIP TIP OF GRIPPER FOR PARTS HAVING DIFFERENT SHAPE IN SURFACE MOUNT DEVICE

(75) Inventor: Dong June Kim, Kyungki-do (KR)

(73) Assignee: Mirae Corporation, Choongchungnam-do (KR)

( * ) Notice: Subject to any disclaimer, the term of this patent is extended or adjusted under 35 U.S.C. 154(b) by 348 days.

This patent is subject to a terminal disclaimer.

(21) Appl. No.: 09/987,662

(22) Filed: Nov. 15, 2001

(65) Prior Publication Data

US 2002/0069516 A1 Jun. 13, 2002

(30) Foreign Application Priority Data

Dec. 13, 2000 (KR) .................................. 10-2000-76148

(51) Int. Cl.[7] .................................................. H05K 3/30
(52) U.S. Cl. ........................... 29/740; 29/739; 29/741; 29/832; 294/88; 294/103.1; 294/116; 294/119.1; 294/902; 901/37; 901/39
(58) Field of Search .......................... 29/739, 740, 741, 29/832; 294/88, 103.1, 116, 119.1, 902; 901/37, 39

(56) References Cited

U.S. PATENT DOCUMENTS

| | | |
|---|---|---|
| 3,204,997 A | 9/1965 | De Vries |
| 4,593,948 A | 6/1986 | Borcea et al. |
| 4,607,873 A | 8/1986 | Nusbaumer et al. |
| 4,680,523 A | 7/1987 | Goumas et al. |
| 4,831,721 A | 5/1989 | Hirai et al. |
| 5,125,708 A | 6/1992 | Borcea et al. |
| 5,190,334 A | 3/1993 | Sawdon |
| 5,762,391 A | 6/1998 | Sumnitsch |
| 5,967,581 A | 10/1999 | Bertini |
| 6,012,222 A | 1/2000 | Asai et al. |
| 6,334,641 B1 | 1/2002 | Oh |
| 6,497,440 B2 * | 12/2002 | Kim ............................ 294/88 |

FOREIGN PATENT DOCUMENTS

| | | |
|---|---|---|
| DE | 33 22 142 A1 | 12/1984 |
| DE | 43 20 071 A1 | 1/1994 |
| DE | 2 263 618 | 7/1994 |

* cited by examiner

Primary Examiner—Richard Chang
(74) Attorney, Agent, or Firm—Fleshner & Kim, LLP

(57) ABSTRACT

A gripper having a grip tip for parts having different shapes is provided for a surface mount device. The gripper includes a piston installed inside of a through hole formed in a holder, and lifted or lowered by air flown in/out through the through hole, a moving unit connected to fixed blocks of the holder by a connection device configured to increase or decrease an interval according to the lifting or lowering operation of the piston, and multiple grip tips configured to support at least three points of a parts having a different shape.

21 Claims, 6 Drawing Sheets

GRIP TIP OF GRIPPER FOR PARTS HAVING DIFFERENT SHAPE IN SURFACE MOUNT DEVICE

BACKGROUND OF THE INVENTION

1. Field of the Invention

The present invention relates to a grip tip of a gripper for a parts having a different shape in a surface mount device, and in particular to an improved grip tip which can be easily attached/detached to/from a gripper for picking up a parts having a different shape, transferring the parts to a printed circuit board, and mounting the parts on the printed circuit board, and which can firmly support the parts, when a surface mount device mounts the parts on the printed circuit board.

2. Description of the Background Art

A surface mount device is used to rapidly precisely mount a plurality of parts on a printed circuit board. A structure of the surface mount device for rapidly precisely mounting parts on the printed circuit board will now be explained with reference to the accompanying drawings. FIG. 1 is a plan view illustrating the surface mount device. As shown therein, the surface mount device 10 includes an X-Y gantry 11, a printed circuit board conveyor 12, a module head 13 and a nozzle exchanging apparatus 14.

The X-Y gantry 11 transfers the module head 13 in an X-Y axis direction. The module head 13 transferred by the X-Y gantry 11 in the X-Y axis direction transfers a parts to a printed circuit board 1. The printed circuit board 1 is transferred to a mounting operation position A by the printed circuit board conveyor 12. When the printed circuit board 1 is transferred to the mounting operation position A by the printed circuit board conveyor 12, the module head 13 sucks the parts, transfers the parts to the printed circuit board 1, and mounts the parts on the printed circuit board 1.

The module head 13 sucking the parts and transferring the sucked parts to the printed circuit board 1 includes a plurality of nozzle devices 20. A structure of the nozzle device 20 will now be explained with reference to FIG. 2. Referring to FIG. 2, the nozzle device 20 includes a socket unit 21 and a holder unit 22. The socket unit 21 includes a hollow shaft 21a, an assembly block 21b, a connection block 21c, a socket shaft 21d and an elastic member 21e. The holder unit 22 includes a holder 22a and a holder shaft 22b.

The hollow shaft 21a of the socket unit 21 has a hollow, and the connection block 21c is installed by the assembly block 21b on the bottom surface of the hollow shaft 21a. The holder 22a of the holder unit 22 is provided in the connection block 21c installed by the assembly block 21b. The socket shaft 21d and the elastic member 21c are disposed at the bottom surface of the connection block 21c in order to firmly and detachably support the holder 22a installed in the connection block 21c.

The socket shaft 21d of the connection block 21c is supported at both side portions of the connection block 21c by the elastic member 21e. The socket shaft 21d installed at both side portions of the connection block 21c by the elastic member 21e supports both side portions of the holder 22a of the holder unit 22 in installation. The holder shaft 22b is formed on the bottom surface of the holder 22a having its side portions supported by the socket shaft 21d.

When the holder 22a is installed in the connection block 21c, a nozzle (not shown) is mounted on the holder shaft 22b. In this state, a component is sucked by he nozzle, transferred to the printed circuit board 1, and mounted thereon. To replace the holder unit 22, the socket unit 21 is moved to a nozzle exchanging apparatus (14 in FIG. 1), and rapidly moved in a vertical direction to pick up the holder unit 22, thereby mounting and replacing the holder unit 22. The nozzle (not shown) is mounted inside of the holder shaft 22b of the replaced holder unit 22.

The nozzle is formed to pick up a surface mounting parts having a constant shape and size and to mount the parts on the printed circuit board. Accordingly, a gripper is used to pick up a parts having a different shape and size. However, the conventional gripper does not firmly pick up the parts having the different shape and size, and is not easily attached or detached.

SUMMARY OF THE INVENTION

Accordingly, it is a primary object of the present invention to provide a grip tip which can firmly support a parts having a different shape and which can be easily attached/detached to/from a gripper for the parts having the different shape in a surface mount device, when the gripper mounts the parts on a printed circuit board.

Another object of the present invention is to provide a grip tip which can firmly pick up a parts having a different shape, easily mount the parts on a printed circuit board, and be easily attached/detached to/from a gripper.

In order to achieve the above-described objects of the invention, there is provided, in a surface mount device including a holder mounted in a socket unit to be adhered closely to a socket shaft by an elastic force of an elastic body connected to the socket shaft, a grip tip of a gripper for a parts having a different shape adapted to the surface mount device comprising: a piston installed inside of a through hole formed at the holder, and lifted or lowered by air flown in/out through the through hole; a moving unit adjacently positioned to an inner slanted surface of a slanted member formed on the bottom surface of the piston, and connected to fixed blocks of the holder by a connection means for increasing or decreasing an interval according to the lifting or lowering operation of the piston; and a plurality of grip tips provided to moving blocks of the moving unit through a fixed member, for supporting at least three points of a parts having a different shape.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A grip tip of a gripper for a parts having a different shape in a surface mount device in accordance with a preferred embodiment of the present invention will now be described in detail with reference to the accompanying drawings.

Figure 3:
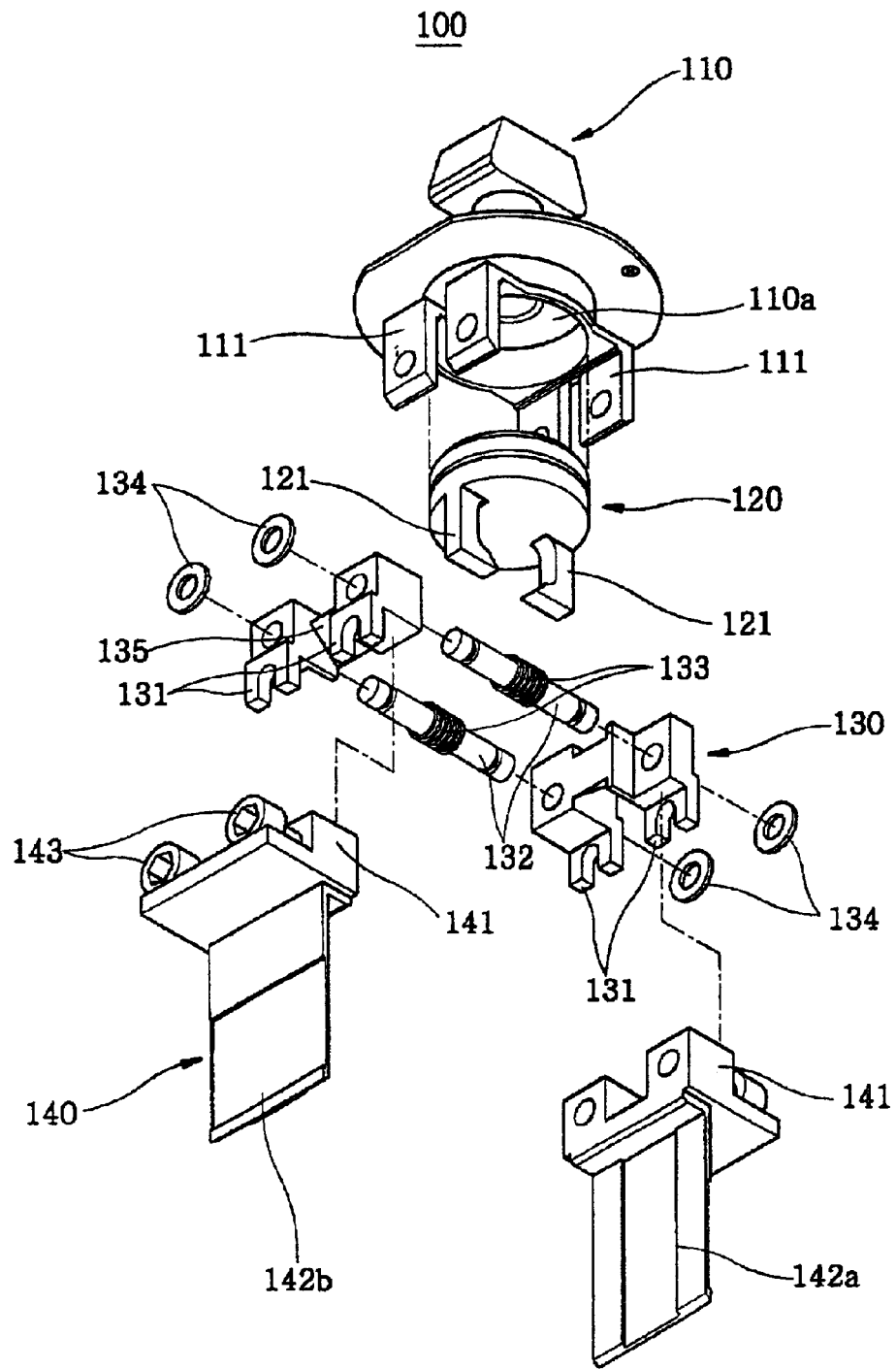
FIG. 3 is an exploded view illustrating gripper for a parts having a different shape in accordance with the present invention.
Figure 4:
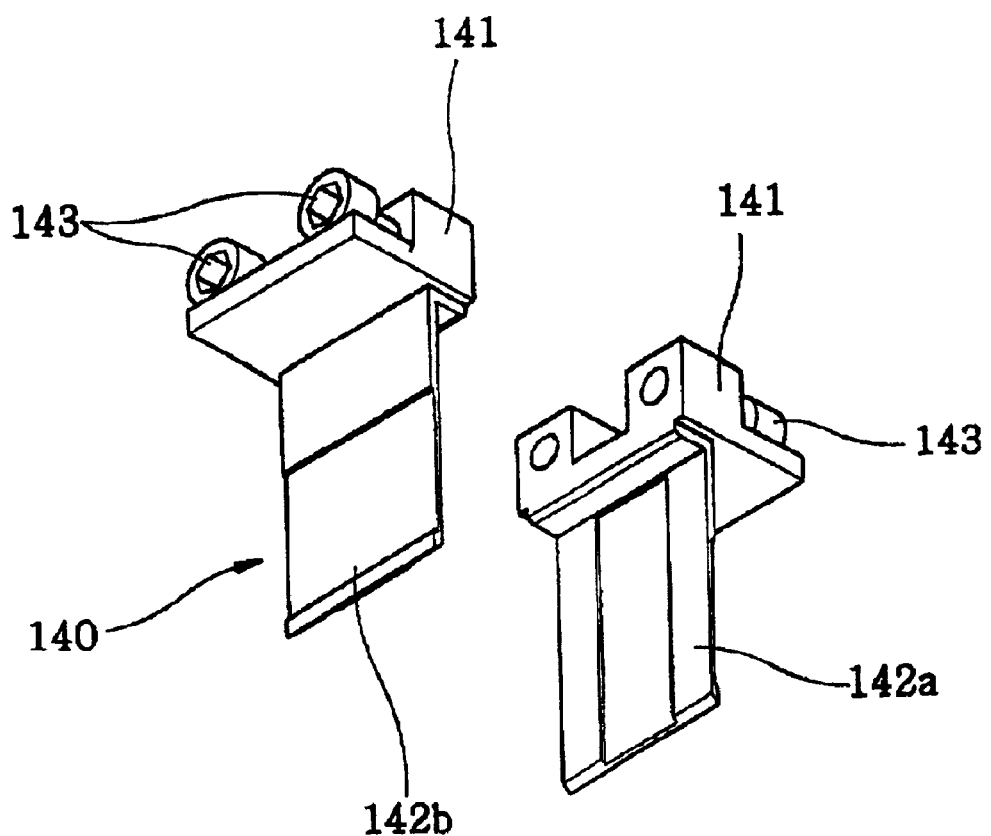
FIG. 4 is a perspective view illustrating an assembly state of a grip tip in FIG. 3.
Figure 5:
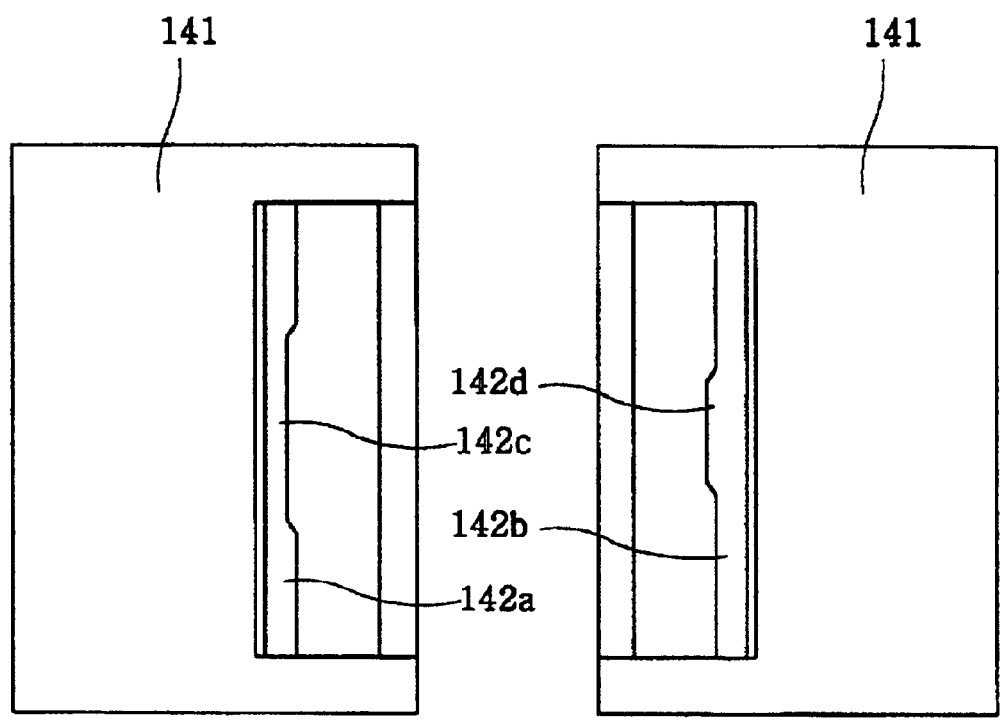
FIG. 5 is a plan view illustrating the grip tip in FIG. 4.

FIG. 3 is an exploded view illustrating a gripper in accordance with the present invention, FIG. 4 is a perspective view illustrating an assembly state of the grip tip in FIG. 3, and FIG. 5 is a plan view illustrating the grip tip in FIG. 4.

Referring to FIGS. 3 to 5, the surface mount device includes: a holder 110 mounted in a socket unit to be adhered closely to a socket shaft by an elastic force of an elastic body connected to the socket shaft; a piston 120 installed in a through hole 110a formed at the holder 110, and lifted or lowered by air flown in/out through the through hole 110a; a moving unit 130 adjacently positioned to an inner slanted surface of a slanted member 121 formed on the bottom surface of the piston 120, and connected to fixed blocks 111 of the holder 110 by a connection unit for increasing or decreasing an interval according to the lifting or lowering operation of the piston 120; and a plurality of grip tips 140 provided to moving blocks 131 of the moving unit 130 through wrench bolts 143, for supporting at least three points of a parts having a different shape.

The plurality of grip tips 140 respectively include assembly blocks 141 fixed to the moving blocks 131 of the moving unit 130, and tips 142a and 142b formed on the bottom surface of the assembly blocks 141. In the tips 142a and 142b, the first tip 142a is disposed at one assembly block 141 and has a concave region 142c, and the second tip 142b is disposed at the other assembly block 141 and has a convex region 142d. A slanted surface 135 is formed at the center portion of the moving block 131 of the moving unit 130, is contacted with the inner slanted surface of the slanted member 121, so that when the piston 120 is lifted, the interval between the moving blocks 131 is decreased and when the piston 120 is lowered, the interval between the moving blocks 131 is increased.

The connection unit includes: a plurality of guide shafts 132 for penetrating and mounting the moving blocks 131 between the two fixed blocks 111; elastic members 133 installed on the outer surfaces of the guide shafts 132, for applying an elastic force in a direction of increasing an interval between the moving blocks 131; and snap rings 134 inserted into both ends of the guide shafts 132, for preventing the guide shafts 132 from being separated from the fixed blocks 111.

The structure and operation of the present invention will now be explained in more detail.

Figure 1:
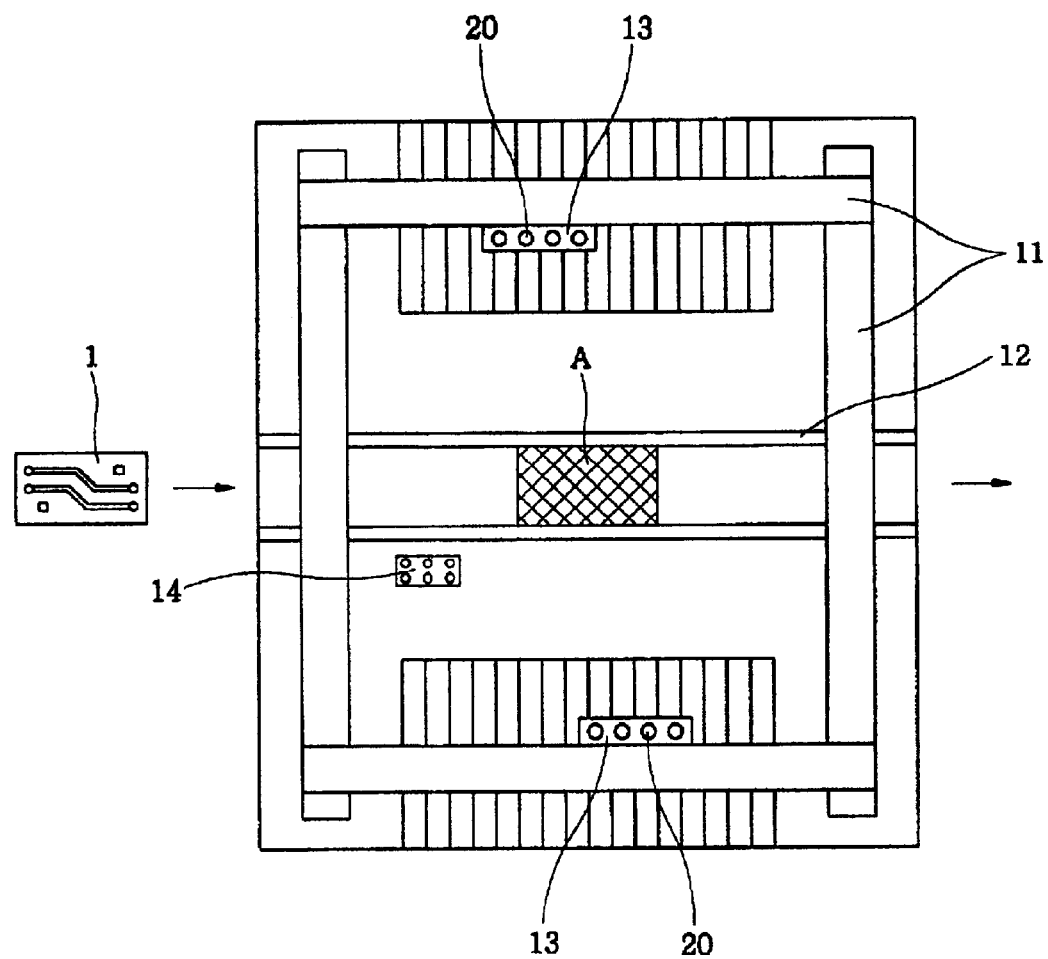
FIG. 1 is a plan view illustrating a surface mount device.
Figure 2:
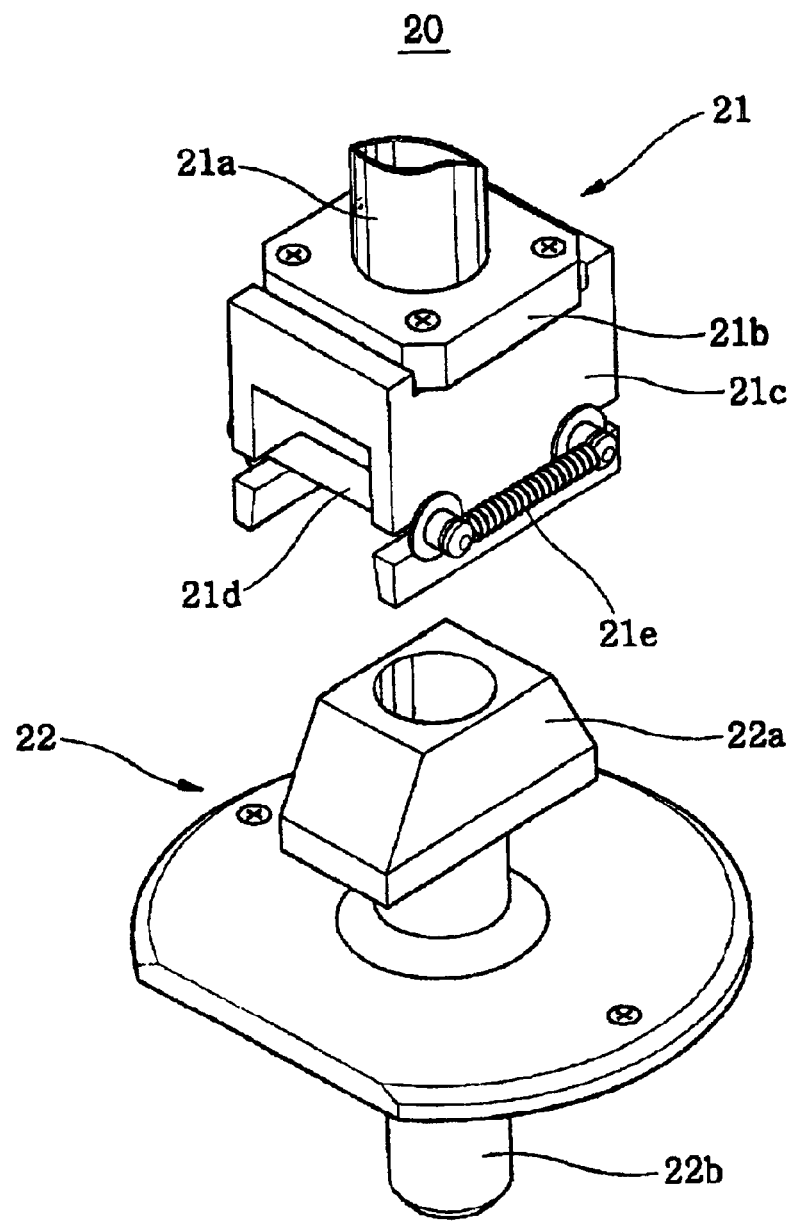
FIG. 2 is a perspective view illustrating a conventional nozzle device in FIG. 1.

The grip tips 140 are transferred to face each other, and air is externally flown in/out through the holder 110 to pick up a component having a different shape and size. The holder 110 has one end positioned inside of the holder unit (22, shown in FIG. 2). The through hole 110a having a predetermined diameter is formed in the holder 110 to form a path of air flown in/out through the holder unit 22. The fixed blocks 111 face each other at the other end of the holder 110 having the through hole 110a. Here, the fixed blocks 111 are separated from each other by a predetermined distance in order to fix the moving blocks 130.

The piston 120 is installed inside of the through hole 110a of the holder 110. The moving unit 130 is fixed to the fixed blocks 111. The piston 120 installed inside of the through hole 110a of the holder 110 is lifted or lowered in a vertical direction due to an air pressure flown in/out through the through hole 110a. The slanted member 121 is formed integrally to the bottom surface of the piston 120 lifted or lowered in the through hole 110a.

The slanted member 121 of the piston 120 is contacted to a slanted surface 135 of the moving unit 130, and slid along the surface of the slanted member 121 according to the lifting or lowering operation of the piston 120, for transferring the moving unit 130 in a horizontal direction. That is, when air is flown in through the through hole 110a of the holder 110, the piston 120 is lowered due to air. The slanted member 121 is lowered according to the lowering operation of the piston 120, the slanted surface 135 of the moving unit 130 is moved along the surface of the slanted member 121, so the moving unit 130 is moved to decrease the interval. Conversely, when air is not flown in, the moving unit 130 is moved by the elastic members 133 in a direction increasing an interval between the slanted surfaces 135, thereby lifting the piston 120. Here, the elastic members 133 are installed in the guide shafts 132 of the moving unit 130.

The moving unit 130 laterally moved in a direction decreasing or increasing the interval due to the lifting or lowering operation of the piston 120 includes the moving blocks 131, the guide shafts 132 and the elastic members 133. The moving blocks 131 of the moving unit 130 are installed in the fixed blocks 111 at both side portions of the other end of the holder 110. The guide shafts 132 are provided between the moving blocks 131. Here, the elastic members 133 are respectively positioned on the outer surfaces of the guide shafts 132. The snap rings 134 are fixedly disposed at both ends of the guide shafts 132 and between the moving blocks 131 and the fixed blocks 111.

The guide shafts 132 respectively installed between the moving blocks 131 and the fixed blocks 111 guide the lateral movement of the moving blocks 131. When the moving blocks 131 are laterally moved to be adjacent to each other and then moved to be far from each other, the elastic members 133 of the guide shafts 132 return the moving blocks 131 to original positions thereof with the elastic force.

The grip tips 140 are installed in the moving blocks 131 of the moving unit 130 laterally moved to be adjacent to or far from each other by the wrench bolts 143. The grip tips 140 include the plurality of assembly blocks 141 and the plurality of tips 142a and 142b. The plurality of assembly blocks 141 are installed to the moving blocks 131 by the wrench bolts 143. The wrench bolts 143 are used to replace the grip tips 140, thereby precisely installing the grip tips 140 without an assembly error.

Figure 6:
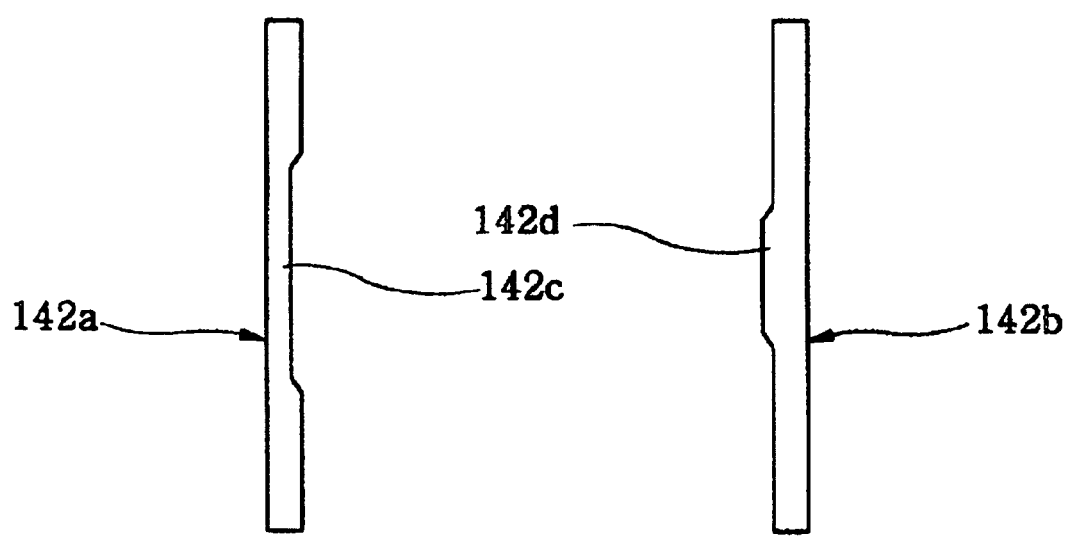
FIG. 6 is a side cross-sectional view illustrating the grip in FIG. 4.

The plurality of tips 142a and 142b easily attached/detached to/from the moving unit 130 by the wrench bolts 143 include the first tip 142a and the second tip 142b. As illustrated in FIG. 6, the first tip 142a has the concave region 142c and the second tip 142b has the convex region 142d.

The concave region 142c and the convex region 142d of the first and second tips 142a and 142b are used to support the three points of the parts having the different shape. That is, in the case of the parts which does not have a horizontal or vertical surface, the concave region 142c and the convex region 142d support at least three points of the parts, thereby firmly picking up the parts.

As described above, the first tip and the second tip are connected to the moving unit by using the wrench bolts, and thus easily attached/detached to/from the moving unit. In addition, the first and second tips have the concave and convex regions, respectively, to firmly support the parts having the different shape.

As discussed earlier, in accordance with the present invention, in the grip tip of the gripper for the parts having the different shape in the surface mount device, the first tip and the second tip are connected to the moving unit by using the wrench bolts, and thus easily attached/detached to/from the moving unit. Moreover, the first and second tips have the concave and convex regions, respectively, to firmly support the component having the different shape.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. In a surface mount device including a holder mounted in a socket unit to be adhered closely to a socket shaft by an elastic force of an elastic body connected to the socket shaft, a grip tip of a gripper for a parts having a different shape adapted to the surface mount device comprising:

a piston installed inside of a through hole formed at the holder, and lifted or lowered by air flown in/out through the through hole;

a moving unit adjacently positioned to an inner slanted surface of a slanted member formed on a bottom surface of the piston, and connected to fixed blocks of the holder by a connection means for increasing or decreasing an interval according to the lifting or lowering operation of the piston; and a plurality of grip tips provided to moving blocks of the moving unit through a fixed member, for supporting at least three points of a parts having a different shape.

2. The grip tip of a gripper in accordance with claim 1, wherein the plurality of grip tips comprises assembly blocks fixed to the moving blocks of the moving unit, and tips formed on respective bottom surfaces of the assembly blocks, and wherein the tips comprise:

a first tip disposed at one assembly block and having a concave region; and a second tip disposed at the other assembly block and having a convex region.

3. The grip tip of a gripper in accordance with claim 1, wherein the moving block of the moving unit has a slanted surface formed at a center portion of the moving block of the moving unit, contacted with the inner slanted surface of the slanted member, so that when the piston is lifted, the interval between the moving blocks is decreased and when the piston is lowered, the interval between the moving blocks is increased.

4. The grip tip of a gripper in accordance with claim 1, wherein the connection means comprises a plurality of guide shafts for penetrating and mounting the moving blocks between the two fixed blocks in order to fix the moving block to the fixed block;

elastic members installed on the outer surfaces of the guide shafts, for applying an elastic force in a direction of increasing an interval between the moving blocks; and snap rings inserted into both ends of the guide shafts, for preventing the guide shafts from being separated from the fixed blocks.

5. The grip tip of a gripper in accordance with claim 1, wherein the fixed member comprises a wrench bolt.

6. A holder for a surface mount device configured to be mounted in a socket shaft of a socket unit of the surface mount device by an elastic force of an elastic body connected to the socket shaft, the holder comprising:

a piston configured to be installed inside of a through hole formed in a main body of the holder, and configured to be lifted or lowered by the flow of air in/out through the through hole;

a moving unit configured to be positioned adjacent to an inner slanted surface of a slanted member formed on a bottom surface of the piston, and connected to the main body of the holder by a connection device configured to increase or decrease an interval between moving members of the moving unit according to the lifting or lowering of the piston; and a plurality of grip tips configured to be attached to the moving members of the moving unit and to support at least three points on parts having different shapes.

7. The holder of claim 6, wherein the plurality of grip tips comprises first and second assembly members configured to be attached to the moving members of the moving unit, and a plurality of tips extending from the assembly members.

8. The holder of claim 7, wherein the plurality of tips comprise:

a first tip extending from a bottom surface of one of the assembly member and having a concave region; and a second tip extending from a bottom surface of another of the assembly members and having a convex region.

9. The holder of claim 7, wherein the assembly members are attached to the moving members of the moving unit by one or more fixing members.

10. The holder of claim 9, wherein the one or more fixing members comprises one or more wrench bolts.

11. The holder of claim 7, wherein each of the moving members of the moving unit has a slanted surface formed at a center portion of the moving member and configured to contact with the inner slanted surface of the slanted member, so that when the piston is lifted, the interval between the moving members is decreased and when the piston is lowered, the interval between the moving members is increased.

12. The holder of claim 7, wherein the connection device comprises:

a plurality of guide shafts configured to movably mount the moving blocks to the holder;

elastic members configured to apply an elastic force in a direction of increasing an interval between the moving blocks; and delimiting members configured to prevent the guide shafts from being separated from the holder.

13. The holder of claim 12, wherein the delimiting members comprise snap rings inserted onto both ends of the guide shafts.

14. A gripper for gripping parts having different shapes, the gripper comprising:

a main body;

a piston instailed in a through hole formed in the main body, and configured to be lifted or lowered by air flown in/out through the through hole;

a moving unit positioned adjacent to the piston and having at least one surface in sliding communication with a slanted surface formed on a bottom surface of the piston; and a plurality of grip tips attached to the moving unit and configured to support at least three points of parts having different shapes, wherein an interval between the grip tips increases or decreases according to the lifting or lowering operation of the piston.

15. The gripper of claim 14, wherein the plurality of grip tips comprises assembly blocks fixed to the moving blocks of the moving unit, and a plurality of tips extending from the assembly blocks.

16. The gripper of claim 15, wherein the plurality of tips comprise:

a first tip having a concave region; and a second tip having a convex region.

17. The gripper of claim 15, wherein the assembly members are attached to the moving members of the moving unit by one or more fixing members.

18. The gripper of claim 17, wherein the one or more fixing members comprises one or more wrench bolts.

19. The gripper of claim 14, wherein the moving unit comprises a plurality of moving blocks and each moving block has a slanted surface formed facing a center portion of the moving unit and configured to slidingly communicate with an inner slanted surface of the slanted member of the piston, so that when the piston is lifted, the interval between the moving blocks is decreased and when the piston is lowered, the interval between the moving blocks is increased.

20. The gripper of claim 14, wherein the moving unit is positioned adjacent the piston by a connection device comprising:

a plurality of guide shafts configured to slidably attach the moving blocks to the main body;

elastic members configured to apply an elastic force in a direction of increasing an interval between the moving blocks; and delimiting members configured to prevent the guide shafts from being separated from the main body.

21. The gripper of claim 20, wherein the delimiting members comprise snap rings inserted onto both ends of the guide shafts.

* * * * *